United States Patent
Gong et al.

(10) Patent No.: US 12,197,664 B2
(45) Date of Patent: Jan. 14, 2025

(54) DISPLAY PANEL AND DISPLAY DEVICE

(71) Applicants: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(72) Inventors: Houfu Gong, Hubei (CN); Yalong Ma, Hubei (CN); Zengjian Jin, Hubei (CN)

(73) Assignees: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/614,329

(22) PCT Filed: Sep. 18, 2021

(86) PCT No.: PCT/CN2021/119260
§ 371 (c)(1),
(2) Date: Nov. 24, 2021

(87) PCT Pub. No.: WO2023/039869
PCT Pub. Date: Mar. 23, 2023

(65) Prior Publication Data
US 2024/0028146 A1    Jan. 25, 2024

(30) Foreign Application Priority Data
Sep. 14, 2021 (CN) .......................... 202111074094.3

(51) Int. Cl.
*G06F 3/041* (2006.01)
*G06F 3/044* (2006.01)
(Continued)

(52) U.S. Cl.
CPC ........ *G06F 3/0412* (2013.01); *G06F 3/04164* (2019.05); *G06F 3/0446* (2019.05); *H10K 59/131* (2023.02); *H10K 59/40* (2023.02)

(58) Field of Classification Search
None
See application file for complete search history.

(56) References Cited

U.S. PATENT DOCUMENTS

| 2009/0108738 A1* | 4/2009 | Kwak | ............... | H10K 59/131 |
| | | | | 313/504 |
| 2015/0097808 A1* | 4/2015 | Roh | ............... | G06F 3/04184 |
| | | | | 345/174 |

(Continued)

FOREIGN PATENT DOCUMENTS

| CN | 104375305 A | 2/2015 |
| CN | 104850268 A | 8/2015 |

(Continued)

OTHER PUBLICATIONS

International Search Report in International application No. PCT/CN2021/119260, mailed on May 27, 2022.

(Continued)

*Primary Examiner* — Christopher R Lamb
(74) *Attorney, Agent, or Firm* — PV IP PC; Wei Te Chung

(57) ABSTRACT

Embodiments of the present disclosure provide a display panel and a display device, the display panel forms multiplexing electrodes on a common electrode layer, and the multiplexing electrodes can transmit a common signal and a touch signal, a function of the common electrodes and a (Continued)

touch function are realized, parasitic capacitances between the touch electrodes and the common electrodes are eliminated, and the display effect and the touch effect are improved, and by using the power management chip to connect to the multiplexing electrodes, the signal input to the multiplexing electrode can be realized, and a function of the multiplexing electrodes can be realized.

7 Claims, 8 Drawing Sheets

(51) Int. Cl.
  *H10K 59/131* (2023.01)
  *H10K 59/40* (2023.01)

(56) References Cited

U.S. PATENT DOCUMENTS

| | | | |
|---|---|---|---|
| 2017/0031512 A1* | 2/2017 | Zou | G06F 3/0412 |
| 2017/0237037 A1* | 8/2017 | Choi | H10K 50/844 |
| | | | 257/40 |

FOREIGN PATENT DOCUMENTS

| | | |
|---|---|---|
| CN | 104991683 A | 10/2015 |
| CN | 105573556 A | 5/2016 |
| CN | 107092400 A | 8/2017 |
| CN | 206774549 U | 12/2017 |
| CN | 108364605 A | 8/2018 |
| CN | 110189712 A | 8/2019 |
| KR | 20140039470 A | 4/2014 |

OTHER PUBLICATIONS

Written Opinion of the International Search Authority in International application No. PCT/CN2021/119260, mailed on May 27, 2022.

Chinese Office Action issued in corresponding Chinese Patent Application No. 202111074094.3 dated Jun. 3, 2023, pp. 1-6.

\* cited by examiner

DISPLAY PANEL AND DISPLAY DEVICE

TECHNICAL FIELD

The present disclosure relates to a field of display device technology, and more particularly to a display panel and a display device.

BACKGROUND

With development of display technology towards thinner, lighter, more flexible, and wider viewing angles, organic light-emitting diode (OLED) display devices have been widely used because of having advantages such as not needing a backlight, bendable, wide viewing angles, ultra-high contrast, fast response speed, etc. In order to further achieve lightness and thinness of the OLED display devices, the prior art adopts a design of direct on cell touch (DOT, a touch layer is directly fabricated on a panel) to reduce thickness of the OLED display devices. However, the OLED display devices with existing DOT designs can cause large parasitic capacitances between driving electrodes and receiving electrodes and cathodes, resulting in a large touch driving load and a poor touch effect. Existing DOT designs adopt double-layer metal, which affects transmittance and has a poor display effect, and a design method of the driving electrodes and the receiving electrodes results in a large thickness of the display panel, and a relatively complex preparation process.

Therefore, the OLED display devices with the existing DOT designs have technical problems of poor display effect and poor touch effect caused by the large parasitic capacitances between touch electrodes and the cathodes.

SUMMARY

Embodiments of the present disclosure provide a display panel and a display device, which are used to alleviate technical problems of poor display effect and poor touch effect caused by large parasitic capacitances between touch electrodes and cathodes in an OLED display device with an existing DOT design.

In order to solve the above problems, technical solutions provided in the present disclosure are as follows:

Embodiments of the present disclosure provide a display panel, the display panel includes:
A substrate.
A driving circuit layer disposed on a side of the substrate.
A light-emitting layer disposed on a side of the driving circuit layer distal to the substrate.
A common electrode layer disposed on a side of the light-emitting layer distal to the driving circuit layer.
Touch electrodes disposed on a side of the common electrode layer distal to the light-emitting layer.
Wherein the common electrode layer includes multiplexing electrodes, and projections of the touch electrodes on the substrate are perpendicular to projections of the multiplexing electrodes on the substrate, the display panel further includes a power management chip, the multiplexing electrodes are connected to the power management chip, and the multiplexing electrodes are configured to transmit a common signal and a touch signal.

In some embodiments, the display panel further includes first touch signal lines and first common signal lines, ends of the multiplexing electrodes are connected to the first touch signal lines, another ends of the multiplexing electrodes are connected to the first common signal lines, and the power management chip is connected to the first common signal lines.

In some embodiments, the display panel further includes diodes, positive electrodes of the diodes are connected to the multiplexing electrodes through the first common signal lines, and negative electrodes of the diodes are connected to the power management chip through the first common signal lines.

In some embodiments, the display panel further includes a touch driving chip, and the touch driving chip is connected to the first touch signal lines.

In some embodiments, the first touch signal lines are connected to the power management chip, and the power management chip is used to output the touch signal and the common signal.

In some embodiments, the common electrode layer further includes common electrodes, the common electrodes are connected to the power management chip, and the common electrodes are used to transmit the common signal.

In some embodiments, the display panel further includes second touch signal lines and second common signal lines, ends of the second touch signal lines are connected to the multiplexing electrodes, another ends of the second touch signal lines are connected to the power management chip, ends of the second common signal lines are connected to the common electrodes, and another ends of the second common signal lines are connected to the power management chip.

In some embodiments, the display panel further includes third touch signal lines, third common signal lines, and fourth common signal lines, the third touch signal lines are connected to ends of the multiplexing electrodes, ends of the third common signal lines are connected to another ends of the multiplexing electrodes, another ends of the third common signal lines are connected to the power management chip, the third touch signal lines are connected to ends of the common electrodes, ends of the fourth common signal lines are connected to another ends of the common electrodes, and another ends of the fourth common signal lines are connected to the power management chip.

In some embodiments, the display panel further includes a touch driving chip, and the touch driving chip is connected to the third touch signal lines.

In some embodiments, the display panel further includes an encapsulation layer and a buffer layer, the encapsulation layer is disposed on a side of the common electrode layer distal to the light-emitting layer, and the buffer layer is disposed between the encapsulation layer and the touch electrodes.

In some embodiments, the display panel further includes an insulating layer and an encapsulating layer, the insulating layer is disposed on a side of the common electrode layer distal to the light-emitting layer, and the encapsulating layer is disposed on a side of the touch electrodes distal to the insulating layer.

At the same time, embodiments of the present disclosure provide a display device, the display device includes a display panel and electronic components, and the display panel includes:
A substrate.
A driving circuit layer disposed on a side of the substrate.
A light-emitting layer disposed on a side of the driving circuit layer distal to the substrate.
A common electrode layer disposed on a side of the light-emitting layer distal to the driving circuit layer.

Touch electrodes disposed on a side of the common electrode layer distal to the light-emitting layer.

Wherein the common electrode layer includes a multiplexing electrode, and a projection of the touch electrode on the substrate is perpendicular to a projection of the multiplexing electrode on the substrate, the display panel further includes a power management chip, the multiplexing electrode is connected to the power management chip, and the multiplexing electrode is configured to transmit a common signal and a touch signal.

In some embodiments, the display panel further includes first touch signal lines and first common signal lines, ends of the multiplexing electrodes are connected to the first touch signal lines, another ends of the multiplexing electrodes are connected to the first common signal lines, and the power management chip is connected to the first common signal lines.

In some embodiments, the display panel further includes diodes, positive electrodes of the diodes are connected to the multiplexing electrodes through the first common signal lines, and negative electrodes of the diodes are connected to the power management chip through the first common signal lines.

In some embodiments, the display panel further includes a touch driving chip, and the touch driving chip is connected to the first touch signal lines.

In some embodiments, the first touch signal lines are connected to the power management chip, and the power management chip is used to output the touch signal and the common signal.

In some embodiments, the common electrode layer further includes common electrodes, the common electrodes are connected to the power management chip, and the common electrodes are used to transmit the common signal.

In some embodiments, the display panel further includes second touch signal lines and second common signal lines, ends of the second touch signal lines are connected to the multiplexing electrodes, another ends of the second touch signal lines are connected to the power management chip, ends of the second common signal lines are connected to the common electrodes, and another ends of the second common signal lines are connected to the power management chip.

In some embodiments, the display panel further includes third touch signal lines, third common signal lines, and fourth common signal lines, the third touch signal lines are connected to ends of the multiplexing electrodes, ends of the third common signal lines are connected to another ends of the multiplexing electrodes, another ends of the third common signal lines are connected to the power management chip, the third touch signal lines are connected to ends of the common electrodes, ends of the fourth common signal lines are connected to another ends of the common electrodes, and another ends of the fourth common signal lines are connected to the power management chip.

In some embodiments, the display panel further includes a touch driving chip, and the touch driving chip is connected to the third touch signal lines.

Embodiments of the present disclosure provide the display panel and the display device. The display panel includes the substrate, the driving circuit layer, the light-emitting layer, the common electrode layer, and the touch electrodes, the driving circuit layer is disposed on a side of the substrate, the light-emitting layer is disposed on a side of the driving circuit layer distal to the substrate, the common electrode layer is disposed on a side of the light-emitting layer distal to the driving circuit layer, the touch electrodes are disposed on a side of the common electrode layer distal to the light-emitting layer, wherein the common electrode layer includes multiplexing electrodes, and projections of the touch electrodes on the substrate are perpendicular to projections of the multiplexing electrodes on the substrate. And the display panel further includes a power management chip, the multiplexing electrodes are connected to the power management chip, and the multiplexing electrodes are used to transmit the common signal and the touch signal. In the present disclosure, the multiplexing electrodes are formed on the common electrode layer, and the multiplexing electrodes can transmit the common signal and the touch signal, a function of the common electrodes and a touch function are realized, an additional layer of touch metal layer does not need to be formed, thickness of the display panel is reduced, light transmittance is improved, and the insulating layer in preparation of the touch layer is reduced accordingly without preparing the touch electrodes, the thickness of the display panel is further reduced, and difficulty and complexity of a process are reduced, at the same time, since the common electrodes are used as the touch electrodes, there is no parasitic capacitance between the touch electrodes and the common electrodes, the parasitic capacitances between the touch electrodes and the common electrodes are eliminated, the display effect and the touch effect are improved. And by using the power management chip to connect to the multiplexing electrodes, the signal input to the multiplexing electrodes can be realized, and a function of the multiplexing electrodes can be realized.

DESCRIPTION OF DRAWINGS

Embodiments of the present disclosure will be described below with reference to accompanying drawings, technical solutions and beneficial effects of the present disclosure will be made obvious.

DETAILED DESCRIPTION OF PREFERRED EMBODIMENTS

Figure 1:
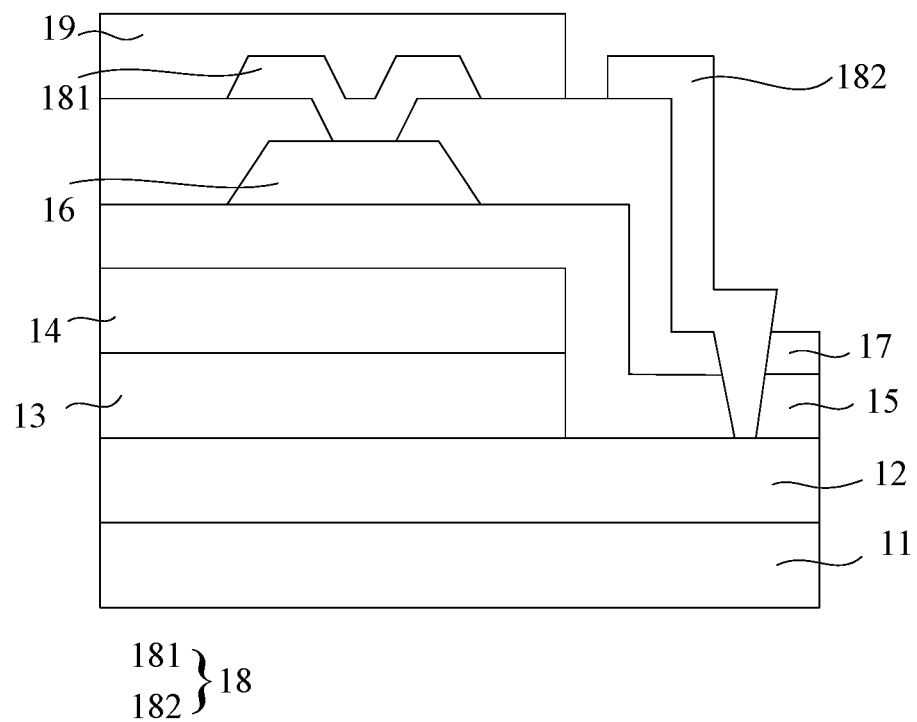
FIG. 1 is a schematic diagram of an OLED display device of prior art.

In order to more clearly explain the technical solutions in embodiments of the present disclosure, the following briefly introduces drawings used in description of the embodiments. Obviously, the drawings in the following description are only some embodiments of the present disclosure. All other embodiments obtained by those skilled in the art without creative work are within the protection scope of the present disclosure As shown in FIG. 1, an OLED display device with an existing DOT design includes a substrate 11, an array layer 12, a light-emitting layer 13, an encapsulating layer 14, and a buffer layer 15. A touch layer with a DOT design includes a driving electrode layer 16, a first insulating layer 17, a receiving electrode layer 18, and a second insulating layer 19. The touch layer is disposed on the buffer layer 15, and the receiving electrode layer 18 includes receiving electrodes 181 and connecting lines 182 connected to the receiving electrodes 181. The corresponding driving electrode layer 16 includes driving electrodes and connecting lines connected to the driving electrodes (not shown in FIG. 1).

As can be known from FIG. 1, the touch layer with the DOT design includes two layers of metal layers and two layers of insulating layers, which results in a large thickness of the OLED display panel and a more complicated manufacturing process, at the same time, since parasitic capacitances are formed between the driving electrodes and the receiving electrodes and common electrodes, a voltage drop of the OLED display device is relatively large, resulting in inconsistent display brightness of each pixel of the OLED display device, which affects a display effect. At the same time, during touch control, the touch control is inaccurate due to a voltage drop problem, which affects a touch effect. Therefore, the OLED display device with the existing DOT design has technical problems of poor display effect and poor touch effect caused by the large thickness and the large parasitic capacitances between touch electrodes and cathodes.

In view of the above technical problems, embodiments of the present disclosure provide a display panel and a display device to alleviate the above technical problems.

Figure 2:
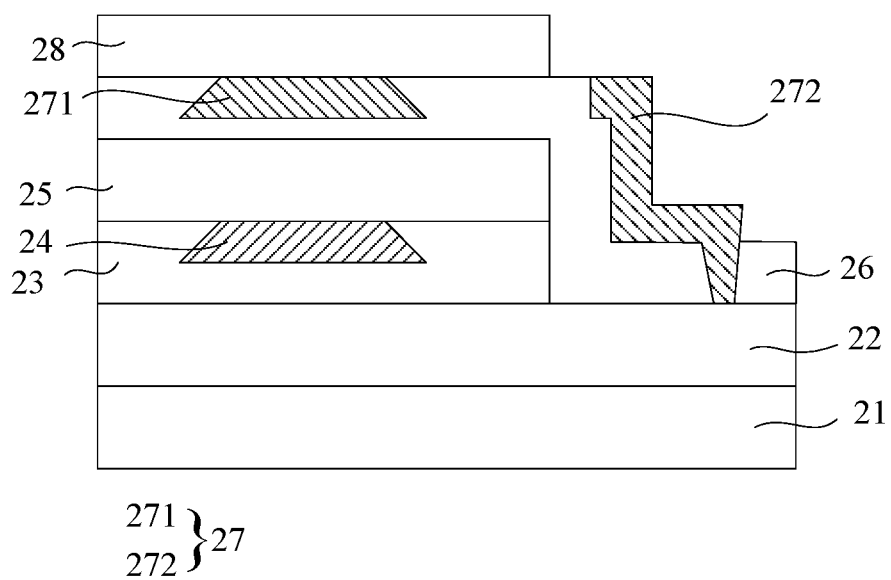
FIG. 2 is a first schematic diagram of a display panel provided by an embodiment of the present disclosure.
Figure 3:
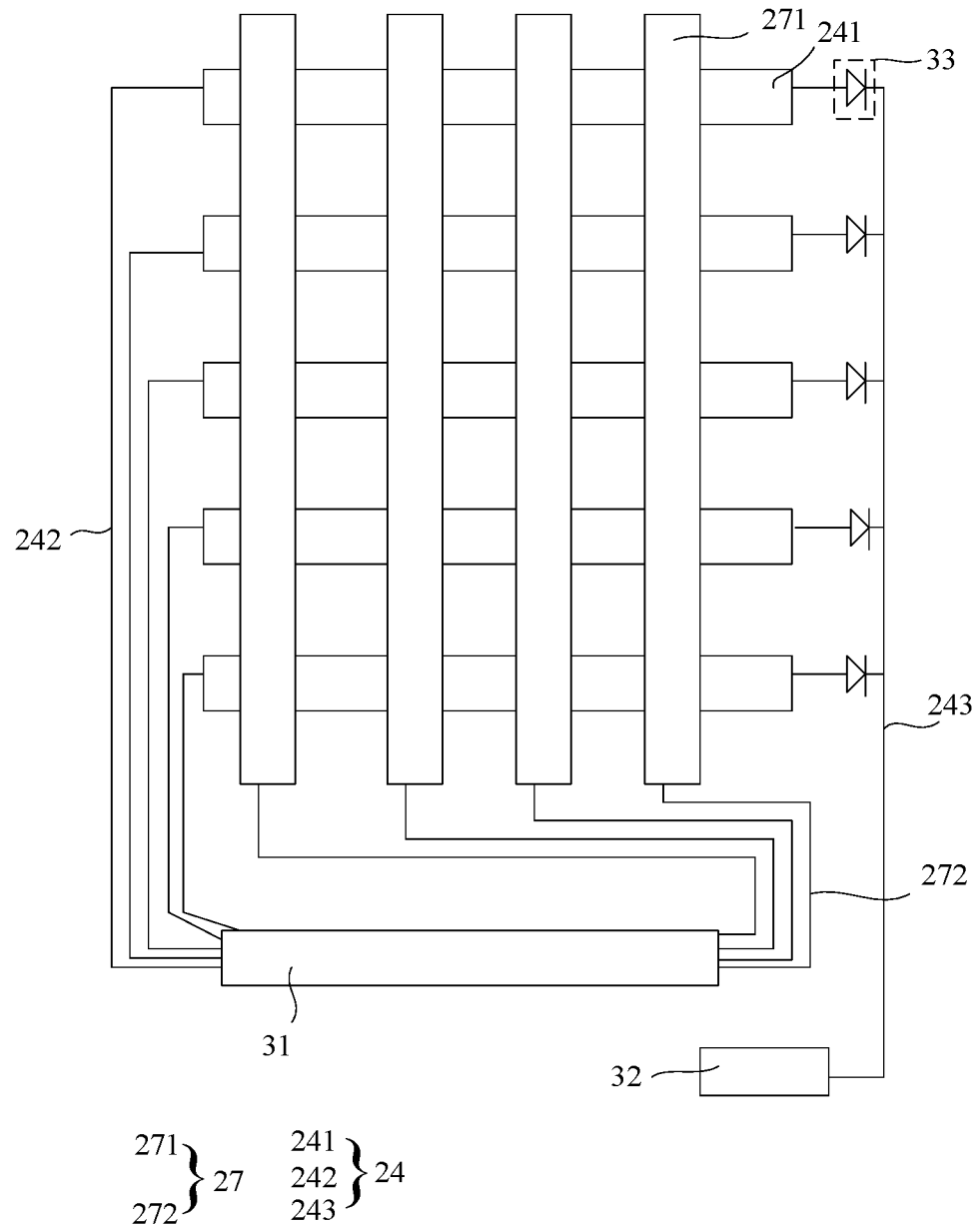
FIG. 3 is a second schematic diagram of a display panel provided by an embodiment of the present disclosure.

As shown in FIG. 2 and FIG. 3, an embodiment of the present disclosure provides a display panel. The display panel includes:

A substrate 21.

A driving circuit layer 22 disposed on a side of the substrate 21.

A light-emitting layer 23 disposed on a side of the driving circuit layer 22 distal to the substrate 21.

A common electrode layer 24 disposed on a side of the light-emitting layer 23 distal to the driving circuit layer 22.

Touch electrodes 271 disposed on a side of the common electrode layer 24 distal to the light-emitting layer 23.

Wherein the common electrode layer 24 includes multiplexing electrodes 241, and projections of the touch electrodes 271 on the substrate 21 are perpendicular to projections of the multiplexing electrodes 241 on the substrate 21. The display panel further includes a power management chip 32, the multiplexing electrodes 241 are connected to the power management chip 32, and the multiplexing electrodes 241 are configured to transmit a common signal and a touch signal.

Embodiments of the present disclosure provide the display panel, according to the display panel, the multiplexing electrodes are formed on the common electrode layer, and the multiplexing electrodes can transmit the common signal and the touch signal, a function of the common electrodes and a touch function are realized, an additional layer of touch metal layer does not need to be formed, thickness of the display panel is reduced, light transmittance is improved, and the insulating layer in the touch layer is correspondingly reduced without preparing the touch electrodes, the thickness of the display panel is further reduced, and difficulty and complexity of a process are reduced, at the same time, since the common electrodes are used as the touch electrodes, there is no parasitic capacitance between the touch electrodes and the common electrodes, parasitic capacitances between the touch electrodes and the common electrodes are eliminated, the display effect and the touch effect are improved. And by using the power management chip to connect to the multiplexing electrodes, the signal input to the multiplexing electrodes can be realized, and a function of the multiplexing electrodes can be realized.

It should be noted that, in some embodiments, the touch signal output by the multiplexing electrodes is used as the driving signal as an example for description, that is, the touch electrodes are used as the receiving electrodes as an example for description.

In an embodiment, as shown in FIG. 3, the display panel further includes first touch signal lines 242 and first common signal lines 243, ends of the multiplexing electrodes 241 are connected to the first touch signal lines 242, another ends of the multiplexing electrodes 241 are connected to first common signal lines 243. The first touch signal lines and the first common signal lines are respectively connected to two ends of the multiplexing electrodes, so that the first touch signal lines can provide a touch signal and a common signal transmission, and the first common signal lines can transmit the common signal, so that the common electrode layer achieves the function of the common electrodes and a function of the touch electrodes.

When a function of the driving electrodes is realized for the common electrodes, the common electrodes need to transmit the driving signal and the common signal, in order to prevent voltage from flowing back. In an embodiment, as shown in FIG. 3, the display panel further includes diodes 33, a positive electrode of the diodes 33 is connected to the multiplexing electrodes 241 through the first common signal lines 243, and negative electrodes of the diodes 33 are connected to the power management chip 32 through the first common signal lines 243. By arranging the diodes between the first common electrode lines and the power management chip, a problem of damage to the power management chip caused by the voltage flowing back to the power management chip can be avoided.

In an embodiment, as shown in FIG. 3, the display panel further includes a touch driving chip 31, and the touch driving chip 31 is connected to the first touch signal lines 242. By using the touch driving chip to be connected to the first touch signal lines, the first touch signal lines may transmit a common signal and a touch signal to the common electrodes, and the power management chip outputs the common signal, so that the common electrode layer can realize the function of common electrodes and the touch function, and the touch drive chip and the power management chip are adopted to output different signals, so that crosstalk of signals can be avoided.

It should be noted that the touch driving chip refers to a touch and display driving integration (TDDI), that is, a touch chip and a driving chip are integrated together, the touch signal required for touch can be output, a receiving signal of the receiving electrodes can be input, and the driving signal required for display can be output, thereby realizing a function of the touch chip and the driving chip.

Figure 4:
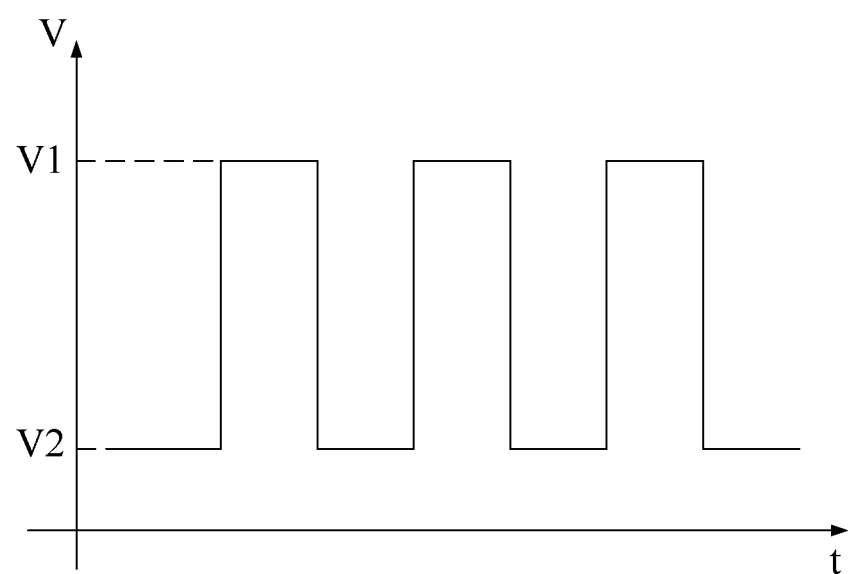
FIG. 4 is a timing diagram of a signal output by a touch driving chip of a display panel provided by an embodiment of the present disclosure.

Specifically, as shown in FIG. 4, an abscissa is time t, an ordinate is a voltage V, and in a timing diagram of a signal output by the touch driving chip, the touch signal is output in a form of square waves, the touch signal includes a touch voltage V2 and a common voltage V1, and at the same time, since the touch voltage V2 is less than the common voltage V1, and the power management chip outputs the common voltage V1, the diodes are disposed on the first common signal lines, so that the signal output by the touch driving chip is prevented from flowing back to a common signal terminal, and by outputting the signal, the function of the common electrodes and the function of the driving electrodes are realized, and the driving electrodes do not need to be separately arranged.

It should be noted that, in the embodiment of the present disclosure, the touch signal includes the touch voltage V2 and the common electrode V1 in the form of square waves as an example for description, when the touch driving chip outputs the touch signal, since there is still a voltage on the common electrodes at this time, although V1 and V2 in the form of square waves are outputs, the display effect can still be achieved, that is, in the embodiment of present disclosure, whether in a touch phase or a non-touch phase, the display panel can continuously achieve the display effect due to the voltage output on the common electrodes, an only difference is that V1 is continuously output as the common signal in the non-touch phase, the square waves are output to realize touch function and display function in the touch phase, and the common signals V1 and V2 are in the form of square waves at this time.

Figure 5:
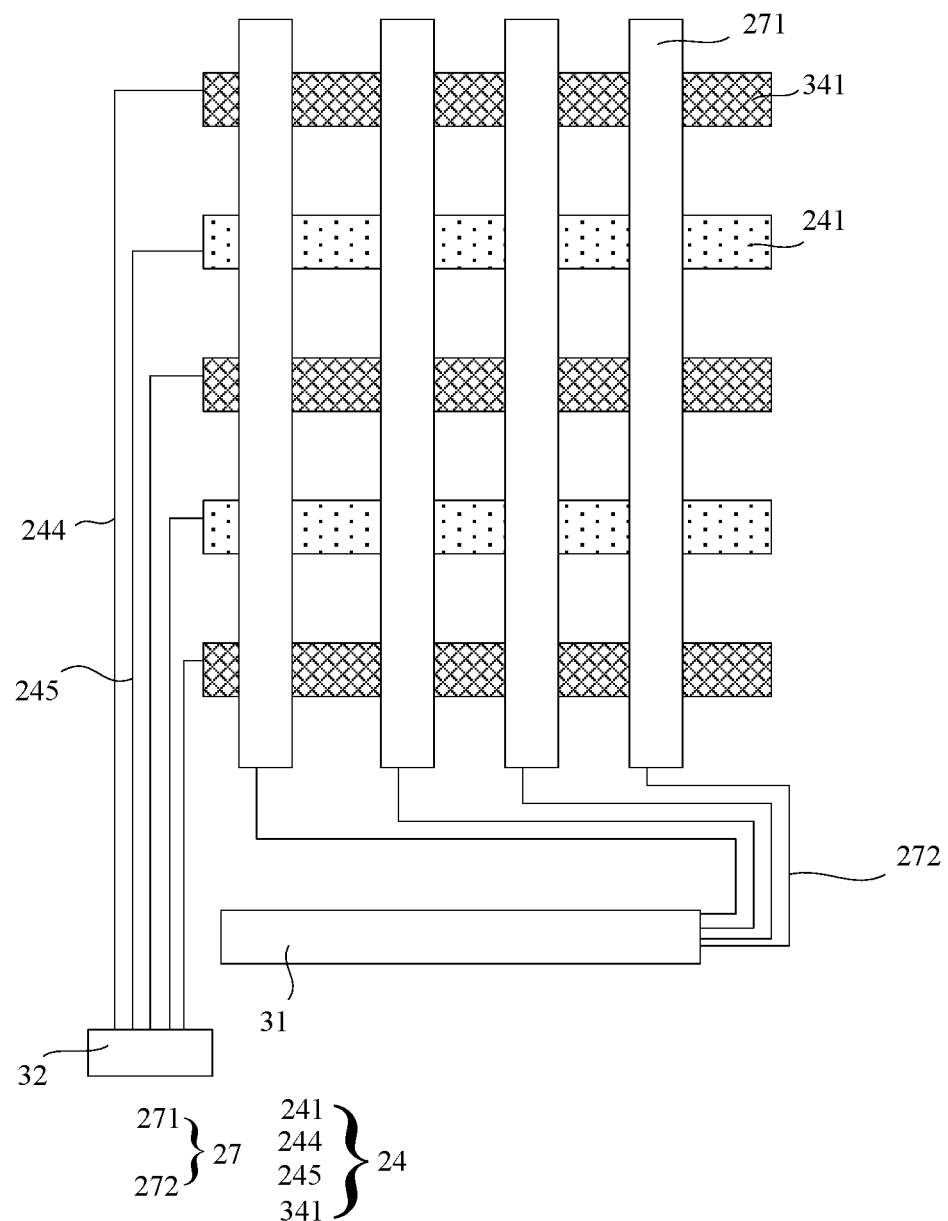
FIG. 5 is a third schematic diagram of a display panel provided by an embodiment of the present disclosure.

In an embodiment, as shown in FIG. 5, the common electrode layer further includes common electrodes 341, the common electrodes 341 are connected to the power management chip 32, and the common electrodes 341 are used to transmit the common signal. The common electrode layer is configured as the multiplexing electrodes and the common electrodes, so that corresponding to a touch area, the multiplexing electrodes transmit the touch signal during touch control, and during non-touch control, the common signal is continuously transmitted, thereby realizing the function of common electrodes and the touch function, and corresponding to a non-touch area, the common electrodes continuously output the common signal to perform display on the display panel.

When the common electrode layer transmits the common signal and the touch signal, disposing signal lines on two sides of the display panel may cause a problem of a large frame of the display panel. In an embodiment, as shown in FIG. 5, the display panel further includes second touch signal lines 245 and second common signal lines 244, ends of the second touch signal lines 245 are connected to the multiplexing electrodes 241, another ends of the second touch signal lines 245 are connected to the power management chip 32, ends of the second common signal lines 244 are connected to the common electrodes 341, and another ends of the second common signal lines 244 are connected to the power management chip 32. For the touch area and the non-touch area of the display panel, by means of an arrangement of the multiplexing electrodes and the common electrodes, the second touch signal lines transmit the touch signal during touch control, the common signal is transmitted during non-touch control, and the second common signal lines continuously transmit the common signal, so that the common electrode layer realizes the function of the common electrodes and the function of the driving electrodes, the driving circuit layer does not need to be additionally disposed, the thickness of the display panel is reduced, and the parasitic capacitances between the touch electrodes and the common electrodes are eliminated, and by using the power management chip to connect respectively to the second common signal lines and the second touch signal lines, the touch driving chip and the power management chip do not need to be used to output signals respectively, the second touch signal lines do not need to be connected to the touch driving chip, a size of the touch driving chip is reduced, a width of the frame of the display panel is reduced, and a narrow frame is realized.

Specifically, a timing diagram of a signal output by the second touch signal lines is shown in FIG. 4, the touch voltage V2 and the common voltage V1 are output in the form of square waves, the touch voltage V2 and the common voltage V1 are output to realize the touch function and the display function during touch control, and the common signal V1 is output to realize the display function during non-touch control.

Figure 6:
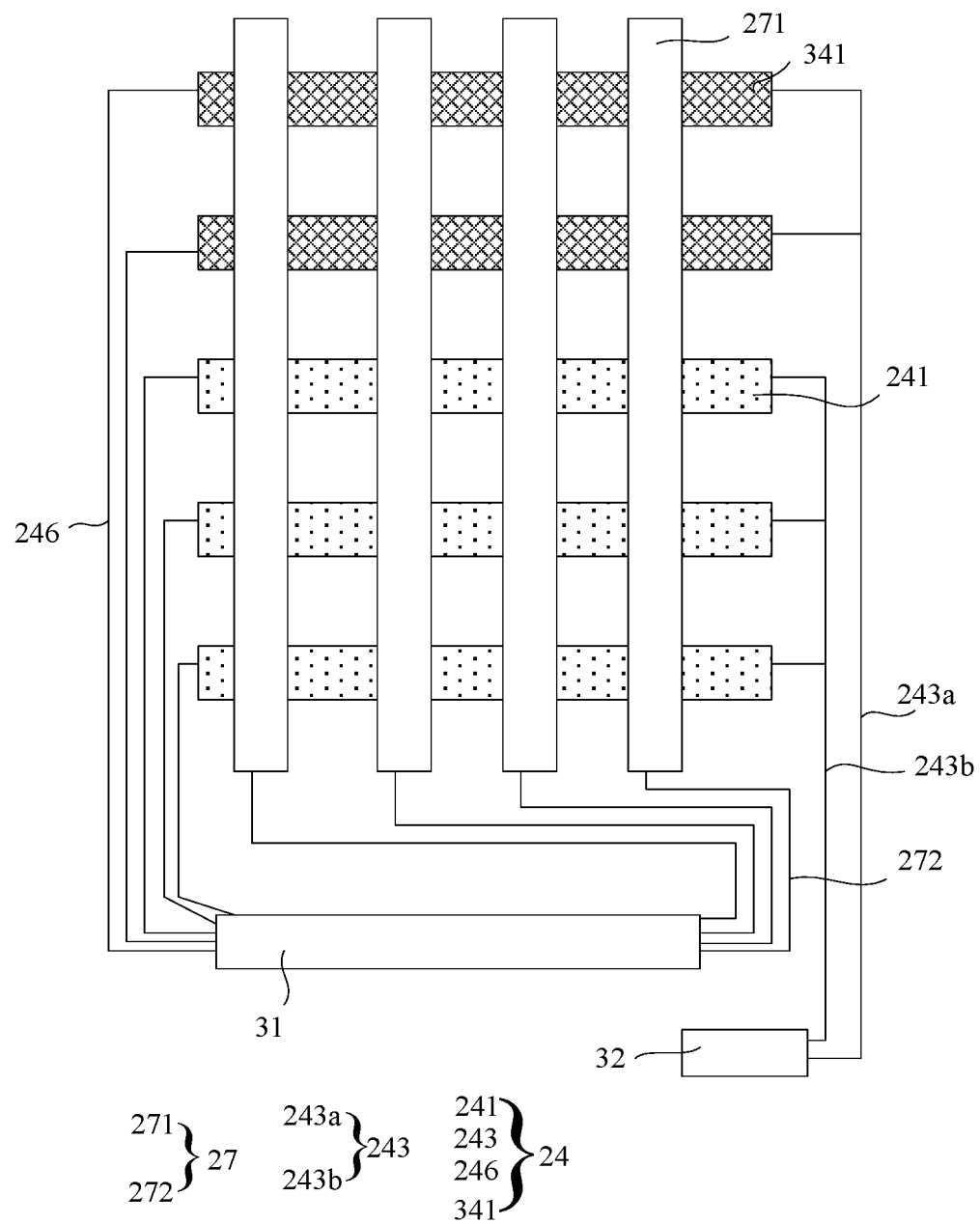
FIG. 6 is a fourth schematic diagram of a display panel provided by an embodiment of the present disclosure.

In an embodiment, as shown in FIG. 6, the display panel further includes third touch signal lines 246, third common signal lines 243b, and fourth common signal lines 243a, the third touch signal lines 246 are connected to ends of the multiplexing electrodes 241, ends of the third common signal lines 243b is connected to another ends of the multiplexing electrodes 241, another ends of the third common signal lines 243b is connected to the power management chip 32, the third touch signal lines 246 are connected to ends of the common electrodes 341, ends of the fourth common signal lines 243a are connected to another ends of the common electrodes 341, and another ends of the fourth common signal lines 243a are connected to the power management chip 32. By connecting the third touch signal lines to ends of the multiplexing electrodes and ends of the common electrodes, the third common signal lines are connected to the another ends of the multiplexing electrodes, and the fourth common signal lines are connected to the another ends of the common electrodes, then in the touch area, the third touch signal lines output the touch signal and the common signal to realize the touch function and the display function, and output the common signal to realize the function of the common electrodes, at this time, the third common signal lines are set to a high resistance state, which is equivalent to an open circuit, so as to prevent the touch signal from flowing back to the power management chip, and the fourth common signal lines correspond to the non-touch area, the common signal is continuously outputted, and the display function is realized.

In an embodiment, as shown in FIG. 6, the display panel further includes a touch driving chip 31, and the touch driving chip 31 is connected to the third touch signal lines 246. The touch driving chip outputs the touch signal and the common signal, so that the common electrode layer realizes the touch function, and the common signal is output through the power management chip, so that in the touch area, the common signal can be continuously output in the non-touch phase, and the common signal can be continuously output in the non-touch area, thereby realizing a power signal output function of the common electrode layer.

Specifically, a timing diagram of a signal output by the third touch signal lines is shown in FIG. 4, the touch voltage V2 and the common voltage V1 are output in the form of square waves, the touch voltage V2 and the common voltage V1 are output to realize the touch function during touch control, and the common voltage V1 is continuously output as the common signal during non-touch control, and at this time, the fourth common signal lines are set to a high resistance (High-Z) state, and the signal output by the third touch signal line is prevented from flowing back to the power management chip, during the non-touch control, the common signal is output through the fourth common signal lines, so that the display panel displays normally, and for the non-touch area, the third common signal lines continuously output the common signal, so that the display panel displays normally.

It should be noted that, in the embodiment corresponding to FIG. 6, the touch area and the non-touch area corresponding to the third common signal lines and the fourth common signal lines are described, however, in the embodiment of the present disclosure, when a touch point changes, areas corresponding to the third common signal lines and the fourth common signal lines may be changed, that is, the third common signal lines correspond to the non-touch area, the fourth common signal lines correspond to the touch area, and the signal output by the third touch signal lines also changes accordingly, in the embodiment of the present disclosure, the touch area and the non-touch area indicate areas during touch, and an area is not limited to always be the touch area, and corresponding non-touch area indicates that a certain time period is the non-touch area, and when the touch signal is received, the area is the touch area.

In an embodiment, as shown in FIG. 2, the display panel further includes an encapsulation layer 25 and a buffer layer 26, the encapsulation layer 25 is disposed on a side of the common electrode layer 24 distal to the light-emitting layer 23, and the buffer layer 26 is disposed between the encapsulation layer 25 and the touch electrodes 271. For the common electrode layer to transmit the touch signal and to realize the function of the driving electrodes, there is no need to set driving electrodes, correspondingly, the touch electrodes can be disposed on the buffer layer, and the touch electrodes and the multiplexing electrodes are vertically arranged, so that the touch function of the display panel can be realized.

Figure 7:
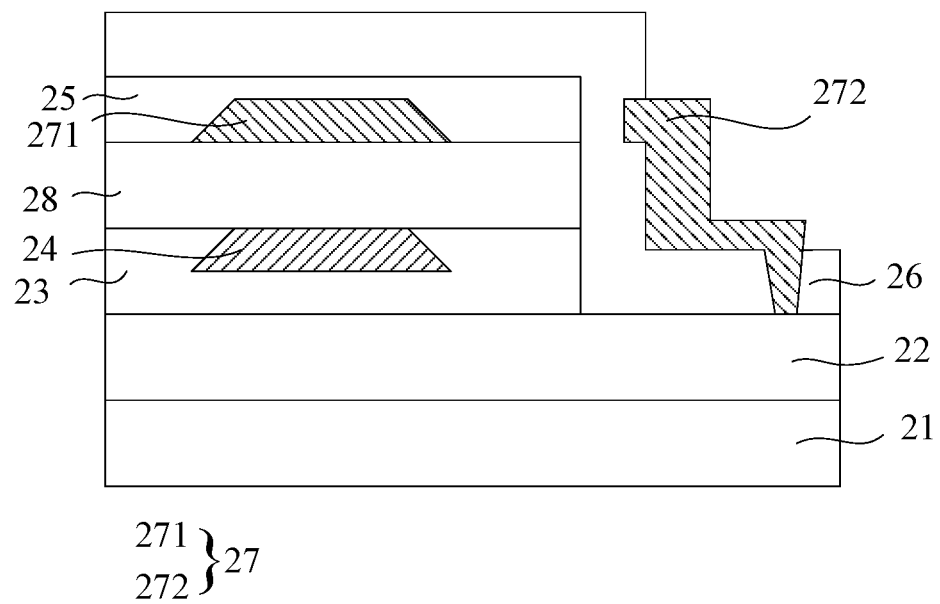
FIG. 7 is a fifth schematic diagram of a display panel provided by an embodiment of the present disclosure.

In an embodiment, as shown in FIG. 7, the display panel further includes an insulating layer 28 and an encapsulating layer 25, the insulating layer 28 is disposed on a side of the common electrode layer 24 distal to the light-emitting layer 23, and the encapsulating layer 25 is disposed on a side of the touch electrodes 271 distal to the insulating layer 28. When the touch signal is a signal of the driving electrodes, the receiving electrodes are also disposed in the encapsulating layer to protect the receiving electrodes and the common electrodes, and the insulating layer is disposed between the receiving electrodes and the common electrodes, so that crosstalk of signals caused by a short circuit between the receiving electrodes and the common electrodes can be avoided, the receiving electrodes and the common electrodes are vertically arranged, and the touch function of the display panel is realized.

It should be noted that, in FIG. 3, FIG. 5 and FIG. 6, the touch electrodes and the multiplexing electrodes are stacked, but in practice, the touch electrodes and the multiplexing electrodes are disposed in different layers, as shown in FIG. 2.

In an embodiment, as shown in FIG. 2 and FIG. 3, the display panel further includes a touch electrode layer 27, and the touch electrode layer 27 includes touch electrodes 271 and receiving signal lines 272, ends of the receiving signal lines 272 are connected to the touch electrodes 271, and another ends of the receiving signal lines are connected to the touch driving chip 31, the receiving electrodes are connected to the touch driving chip through the receiving signal lines, so that when the receiving electrodes sense touch, the receiving electrodes transmit the receiving signal from the receiving signal lines to the touch driving chip, so that the touch point is detected, and the touch function is realized.

In the above embodiment, when the touch electrodes are used as receiving electrodes, and the receiving electrodes are disposed on a side of the encapsulation layer distal to the light-emitting layer, an arrangement method of the common electrode layer is described in detail, in the embodiment of the present disclosure, when the receiving electrodes are disposed between the encapsulation layer and the light-emitting layer, an arrangement method of the corresponding common electrode layer may also adopt any one of arrangements of the multiplexing electrodes, the common electrodes, the common signal lines, and the touch signal line described in the above embodiments, and a connection method of the common signal lines, the common electrodes, the multiplexing electrodes, and the touch signal lines may also adopt any one of connection methods described in the above embodiments, and the common signal lines, the touch signal lines, the touch driving chip, and the power management chip may also adopt any one of connection methods described in the above embodiments, details are not described again.

The above embodiment is described in detail by taking the touch signal as the signal of the driving electrodes as an example. In the above embodiment, since an arrangement direction of the driving electrodes in the prior art is same as the common electrodes, and the driving electrodes are disposed on a long side of the display panel, causing an overlapping area between the driving electrodes and the common electrodes to be larger than an overlapping area between the receiving electrodes and the common electrodes, that is, the parasitic capacitances between the driving electrodes and the common electrodes are larger than the parasitic capacitances between the receiving electrodes and the common electrodes, therefore, in the above embodiment, the signal of the driving electrodes transmitted by the multiplexed electrodes is described in detail, which eliminates the parasitic capacitances between the driving electrodes and the common electrodes, thereby improving the display effect and touch effect of the display panel.

In an embodiment of the present disclosure, the touch signal is not limited to the signal of the driving electrodes, and the touch signal may also be a signal of the receiving electrodes.

Specifically, in an embodiment, the touch electrodes are used as driving electrodes.

In an embodiment of the present disclosure, when the touch signal is used as the signal of the receiving electrodes, a connection method of the receiving signal lines corresponding to the receiving electrodes may correspond to a connection method of the driving signal lines corresponding to the driving electrodes, so that during touch control, the common electrodes transmit the received signal, and during non-touch control, the common electrodes transmit the common signal, and details are not described again in the embodiment of the present disclosure.

Figure 8:
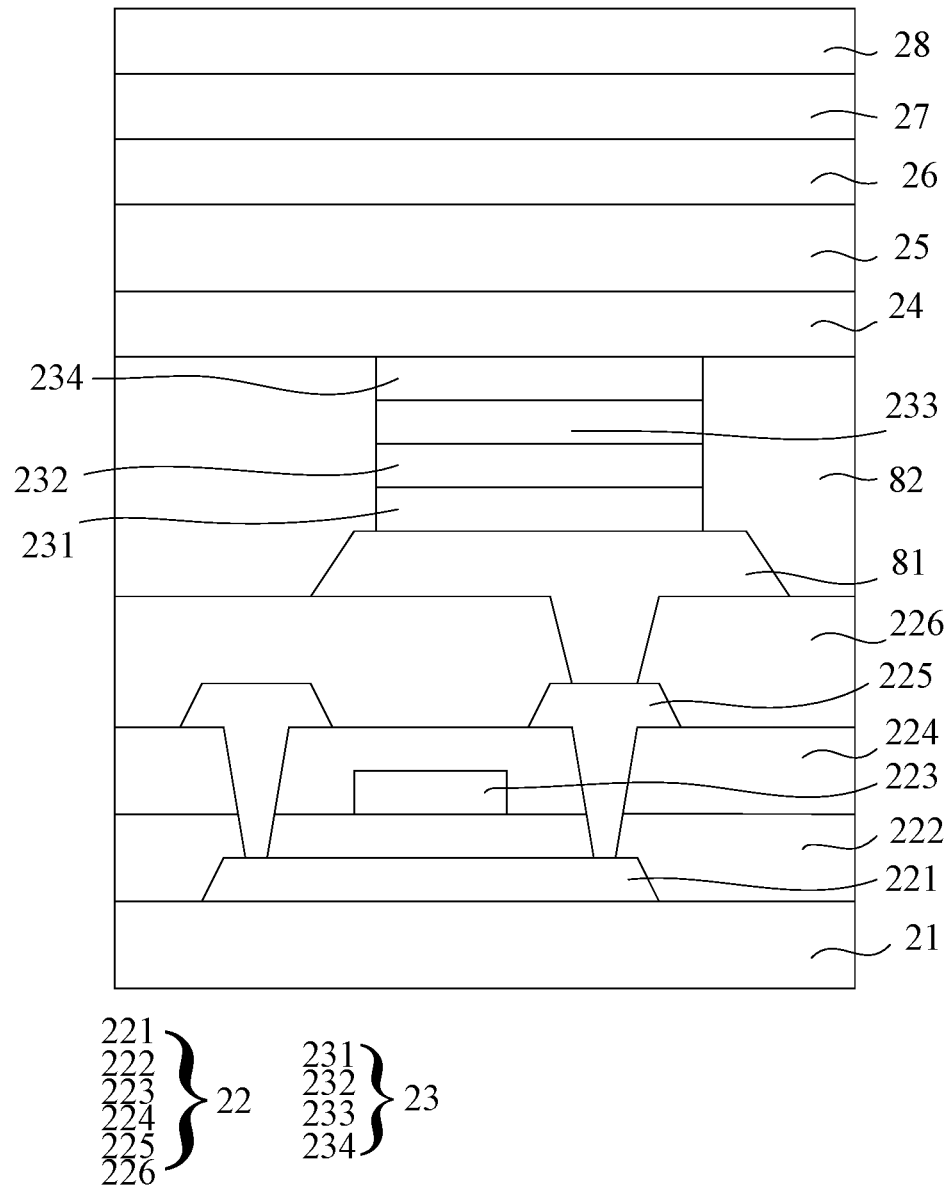
FIG. 8 is a sixth schematic diagram of a display panel provided by an embodiment of the present disclosure.

In an embodiment, as shown in FIG. 8, the driving circuit layer 22 includes an active layer 221, a gate insulating layer 222, a gate layer 223, an interlayer insulating layer 224, a source and drain layer 225, and a planarization layer 226. The embodiment of the present disclosure shows a method for setting the driving circuit layer by using a thin film transistor in contact with a top gate, however, the embodiments of the present disclosure are not limited to this, for display panels with a bottom gate structure or a top gate structure may adopt a design method of the common electrode layer in the embodiments of the present disclosure.

In an embodiment, the display panel further includes a pixel electrode layer 81 and a pixel definition layer 82.

In an embodiment, the light-emitting layer 23 includes a hole injection layer 231, a hole transport layer 232, a light-emitting material layer 233, and an electron transport layer 234, when the display panel is displayed, the pixel electrode layer and the common electrode layer respectively input a driving voltage and a common voltage to excite the light-emitting material layer to emit light.

Specifically, the light-emitting material layer 233 includes a blue light-emitting material, a green light-emitting material, and a red light-emitting material.

In an embodiment, a material of the common electrode layer includes a magnesium-silver stack.

Figure 9:
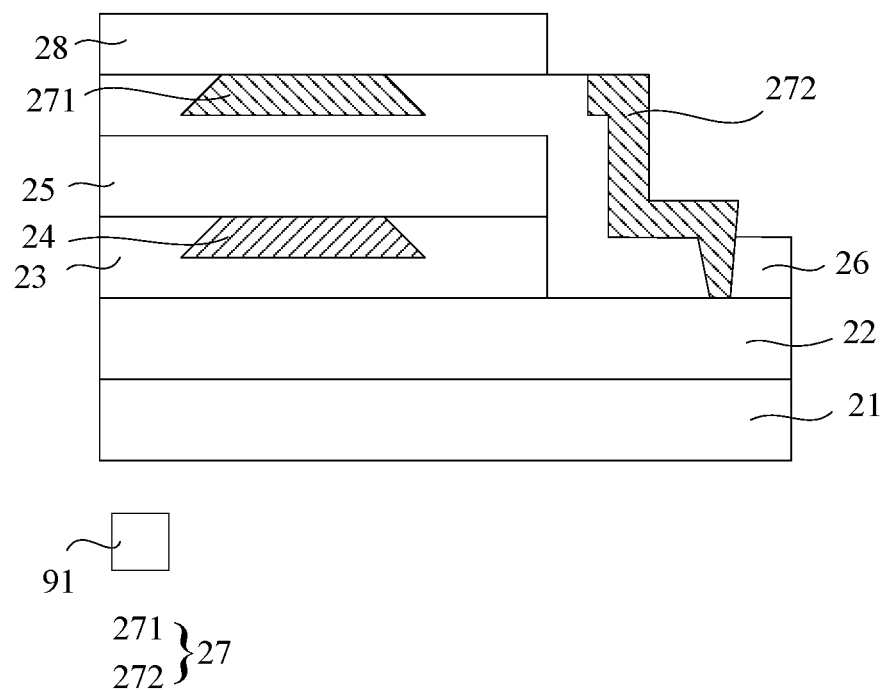
FIG. 9 is a schematic diagram of a display device provided by an embodiment of the present disclosure.

At the same time, as shown in FIG. 9, an embodiment of the present disclosure provides a display device, the display device includes a display panel and electronic components 91, and the display panel includes:

A substrate 21.

A driving circuit layer 22 disposed on a side of the substrate 21.

A light-emitting layer 23 disposed on a side of the driving circuit layer 22 distal to the substrate 21.

A common electrode layer 24 disposed on a side of the light-emitting layer 23 distal to the driving circuit layer 22.

Touch electrodes 271 disposed on a side of the common electrode layer 24 distal to the light-emitting layer 23.

Wherein the common electrode layer 24 includes multiplexing electrodes 241, and projections of the touch electrodes 271 on the substrate 21 are perpendicular to projections of the multiplexing electrodes 241 on the substrate 21. The display panel further includes a power management chip 32, the multiplexing electrodes 241 are connected to the power management chip 32, and the multiplexing electrodes 241 are configured to transmit a common signal and a touch signal.

An embodiment of the present disclosure provides a display device. The display device includes a display panel and electronic components, according to the display panel, the multiplexing electrodes are formed on the common electrode layer, and the multiplexing electrodes can transmit the common signal and the touch signal, a function of the common electrodes and a touch function are realized, an additional layer of touch metal layer does not need to be formed, thickness of the display panel is reduced, light transmittance is improved, and the insulating layer in the touch layer is correspondingly reduced without preparing the touch electrodes, the thickness of the display panel is further reduced, and difficulty and complexity of a process are reduced, at the same time, since the common electrodes are used as the touch electrodes, there is no parasitic capacitance between the touch electrodes and the common electrodes, parasitic capacitances between the touch electrodes and the common electrodes are eliminated, the display effect and the touch effect are improved. And by using the power management chip to connect to the multiplexing electrodes, the signal input to the multiplexing electrodes can be realized, and a function of the multiplexing electrodes can be realized.

In an embodiment, the electronic components include an under-screen camera, and a via hole may be formed in an area corresponding to the under-screen camera to realize lighting of the under-screen camera.

In an embodiment, in the display device, the display panel further includes first touch signal lines and first common signal lines, ends of the multiplexing electrodes are connected to the first touch signal lines, another ends of the multiplexing electrodes are connected to the first common signal lines, and the power management chip is connected to the first common signal lines.

In an embodiment, in the display device, the display panel further includes diodes, positive electrodes of the diodes are connected to the multiplexing electrodes through the first common signal lines, and negative electrodes of the diodes are connected to the power management chip through the first common signal lines.

In an embodiment, in the display device, the display panel further includes a touch driving chip, and the touch driving chip is connected to the first touch signal lines.

In an embodiment, in the display device, the first touch signal lines are connected to the power management chip, and the power management chip is used to output the touch signal and the common signal.

In an embodiment, in the display device, the common electrode layer further includes common electrodes, the common electrodes are connected to the power management chip, and the common electrodes are used to transmit the common signal.

In an embodiment, in the display device, the display panel further includes second touch signal lines and second common signal lines, ends of the second touch signal lines are connected to the multiplexing electrodes, another ends of the second touch signal lines are connected to the power management chip, ends of the second common signal lines are connected to the common electrodes, and another ends of the second common signal lines are connected to the power management chip.

In an embodiment, in the display device, the display panel further includes third touch signal lines, third common signal lines, and fourth common signal lines, the third touch signal lines are connected to ends of the multiplexing electrodes, ends of the third common signal lines are connected to another ends of the multiplexing electrodes, another ends of the third common signal lines are connected to the power management chip, the third touch signal lines are connected to ends of the common electrodes, ends of the fourth common signal lines are connected to another ends of the common electrodes, and another ends of the fourth common signal lines are connected to the power management chip.

In an embodiment, in the display device, the display panel further includes a touch driving chip, and the touch driving chip is connected to the third touch signal lines.

According to the above embodiments:

Embodiments of the present disclosure provide the display panel and the display device. The display panel includes the substrate, the driving circuit layer, the light-emitting layer. The common electrode layer, and the touch electrodes, the driving circuit layer is disposed on a side of the substrate, the light-emitting layer is disposed on a side of the driving circuit layer distal to the substrate, the common electrode layer is disposed on a side of the light-emitting layer distal to the driving circuit layer, the touch electrodes are disposed on a side of the common electrode layer distal to the light-emitting layer. Wherein the common electrode layer includes multiplexing electrodes, and projections of the touch electrodes on the substrate are perpendicular to projections of the multiplexing electrodes on the substrate. And the display panel further includes the power management chip, the multiplexing electrodes are connected to the power management chip, and the multiplexing electrodes are used to transmit the common signal and the touch signal. In the present disclosure, the multiplexing electrodes are formed on the common electrode layer, and the multiplexing electrodes can transmit the common signal and the touch signal, the function of the common electrodes and the touch function are realized, an additional layer of touch metal layer does not need to be formed, thickness of the display panel is reduced, light transmittance is improved, and the insulating layer in preparation of the touch layer is reduced accordingly without preparing the touch electrodes, the thickness of the display panel is further reduced, and difficulty and complexity of the process are reduced, at the same time, since the common electrodes are used as the touch electrodes, there is no parasitic capacitance between the touch electrodes and the common electrodes, the parasitic capacitances between the touch electrodes and the common electrodes are eliminated, the display effect and the touch effect are improved. By using the power management chip to connect to the multiplexing electrodes, the signal input to the multiplexing electrodes can be realized, and the function of the multiplexing electrodes can be realized.

In the above embodiments, the description of each embodiment has its own emphasis, for a part that is not detailed in an embodiment, you can refer to the related descriptions of other embodiments.

The display panel and the display device provided by the embodiments of the present disclosure are described in detail above, specific examples are used to explain the principle and implementation of the present disclosure, the descriptions of the above embodiments are only used to help understand the present disclosure technical solutions and their core ideas. Those of ordinary skill in the art should understand that they can still modify the technical solutions described in the foregoing embodiments, or equivalently replace some of the technical features. These modifications or replacements, and the essence of the corresponding technical solutions does not deviate from the scope of the technical solutions of the embodiments of the present disclosure.

What is claimed is:

1. A display panel, comprising:
  a substrate;
  a driving circuit layer disposed on a side of the substrate;
  a light-emitting layer disposed on a side of the driving circuit layer distal to the substrate;
  a common electrode layer disposed on a side of the light-emitting layer distal to the driving circuit layer;
  touch electrodes disposed on a side of the common electrode layer distal to the light-emitting layer;
  a touch driving chip,
  wherein the common electrode layer comprises multiplexing electrodes, and projections of the touch electrodes on the substrate are perpendicular to projections of the multiplexing electrodes on the substrate, the display panel further comprises a power management chip, the multiplexing electrodes are connected to the power management chip, and the multiplexing electrodes are configured to transmit a common signal and a touch signal, and
  wherein the display panel further comprises first touch signal lines and first common signal lines, one ends of each of the multiplexing electrodes are connected to the first touch signal lines, another end of the multiplexing electrodes are connected to the first common signal line, the first touch signal lines are connected to the touch driving chip and provide transmissions of the touch signal and the common signal, and the first common signal lines transmit only the common signal.

2. The display panel of claim 1, wherein the power management chip is connected to the first common signal lines.

3. The display panel of claim 2, wherein the display panel further comprises diodes, positive electrodes of the diodes are connected to the multiplexing electrodes through the first common signal lines, and negative electrodes of the diodes are connected to the power management chip through the first common signal lines.

4. The display panel of claim 1, wherein the display panel further comprises an encapsulation layer and a buffer layer, the encapsulation layer is disposed on a side of the common electrode layer distal to the light-emitting layer, and the buffer layer is disposed between the encapsulation layer and the touch electrodes.

5. A display device, comprising: a display panel and electronic components, and the display panel comprises:
  a substrate;
  a driving circuit layer disposed on a side of the substrate;
  a light-emitting layer disposed on a side of the driving circuit layer distal to the substrate;
  a common electrode layer disposed on a side of the light-emitting layer distal to the driving circuit layer;
  touch electrodes disposed on a side of the common electrode layer distal to the light-emitting layer;
  a touch driving chip,
  wherein the common electrode layer comprises multiplexing electrodes, and projections of the touch electrodes on the substrate are perpendicular to projections of the multiplexing electrodes on the substrate, the display panel further comprises a power management chip, the multiplexing electrodes are connected to the power management chip, and the multiplexing electrodes are configured to transmit a common signal and a touch signal, and
  wherein the display panel further comprises first touch signal lines and first common signal lines, one end of each of the multiplexing electrodes are connected to the first touch signal line, another ends of the multiplexing electrodes are connected to the first common signal line, the first touch signal lines are connected to the touch driving chip and provide transmissions of the touch signal and the common signal, and the first common signal lines transmit only the common signal.

6. The display device of claim 5, wherein the power management chip is connected to the first common signal lines.

7. The display device of claim 6, wherein the display panel further comprises diodes, positive electrodes of the diodes are connected to the multiplexing electrodes through the first common signal lines, and negative electrodes of the diodes are connected to the power management chip through the first common signal lines.

* * * * *